United States Patent
Ramm et al.

(10) Patent No.: US 8,324,022 B2
(45) Date of Patent: Dec. 4, 2012

(54) ELECTRONIC SYSTEM AND METHOD FOR MANUFACTURING A THREE-DIMENSIONAL ELECTRONIC SYSTEM

(75) Inventors: Peter Ramm, Pfaffenhofen (DE); Armin Klumpp, Munich (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 222 days.

(21) Appl. No.: 12/678,473

(22) PCT Filed: Sep. 17, 2008

(86) PCT No.: PCT/EP2008/007776
§ 371 (c)(1), (2), (4) Date: Jul. 7, 2010

(87) PCT Pub. No.: WO2009/036969
PCT Pub. Date: Mar. 26, 2009

(65) Prior Publication Data
US 2010/0289146 A1    Nov. 18, 2010

(30) Foreign Application Priority Data

Sep. 19, 2007  (DE) .................. 10 2007 044 685

(51) Int. Cl.
*H01L 21/00*    (2006.01)

(52) U.S. Cl. ........ 438/107; 438/110; 257/741; 257/770; 257/774; 257/E23.011; 257/E23.169; 257/E21.576

(58) Field of Classification Search ............ 257/741, 257/770, 774, E21.576, E23.169, E23.011; 438/107, 109, 110
See application file for complete search history.

(56) References Cited

U.S. PATENT DOCUMENTS

| | | | | |
|---|---|---|---|---|
| 5,998,808 A | * | 12/1999 | Matsushita | 257/74 |
| 6,087,719 A | * | 7/2000 | Tsunashima | 257/686 |
| 6,444,576 B1 | * | 9/2002 | Kong | 438/667 |

* cited by examiner

*Primary Examiner* — Jasmine Clark
(74) *Attorney, Agent, or Firm* — Glenn Patent Group

(57) ABSTRACT

A method for manufacturing a three-dimensional, electronic system includes: providing a first integrated circuit structure in a first substrate, wherein the first integrated circuit structure has a first contact pad at a first main side of the first substrate; providing a second substrate with a second main side; forming a vertical contact area in the second substrate; after step (c) forming a semiconductor layer on the second main side of the second substrate; forming a semiconductor device of a second integrated circuit structure in the second substrate with the semiconductor layer; removing the substrate material from a side of the second substrate opposite the second main side, so that the vertical contact area at the opposite side is electrically exposed; arranging the first and second substrates on top of each other aligning the vertical contact area with the contact pad, so that an electrical connection between the first and second integrated circuit structures is produced via the vertical contact area and the contact pad.

33 Claims, 9 Drawing Sheets

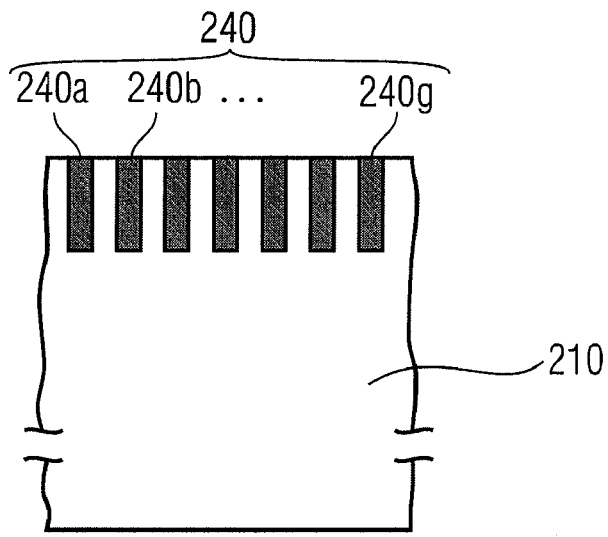
FIGURE 5A
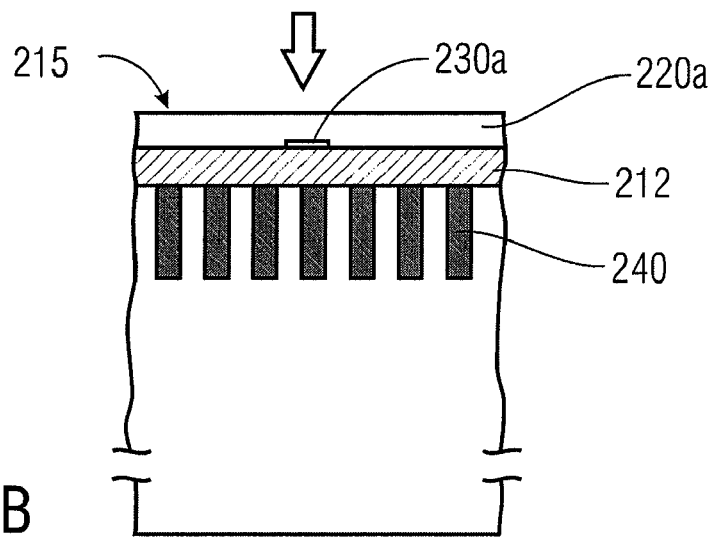
FIGURE 5B
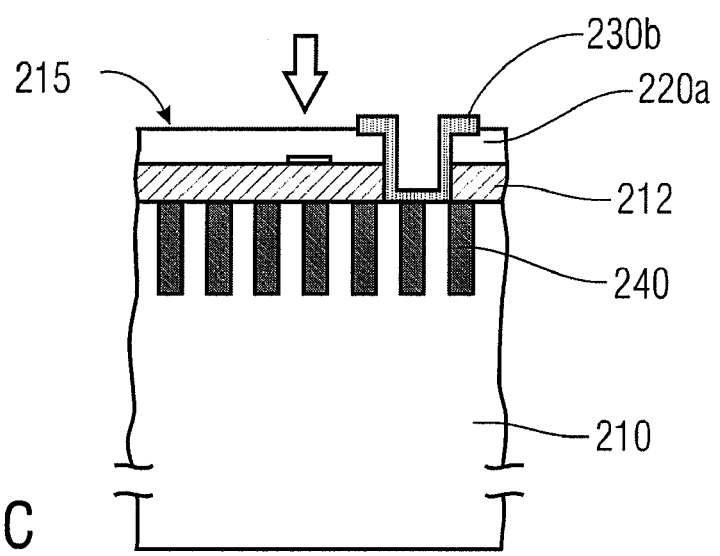
FIGURE 5C

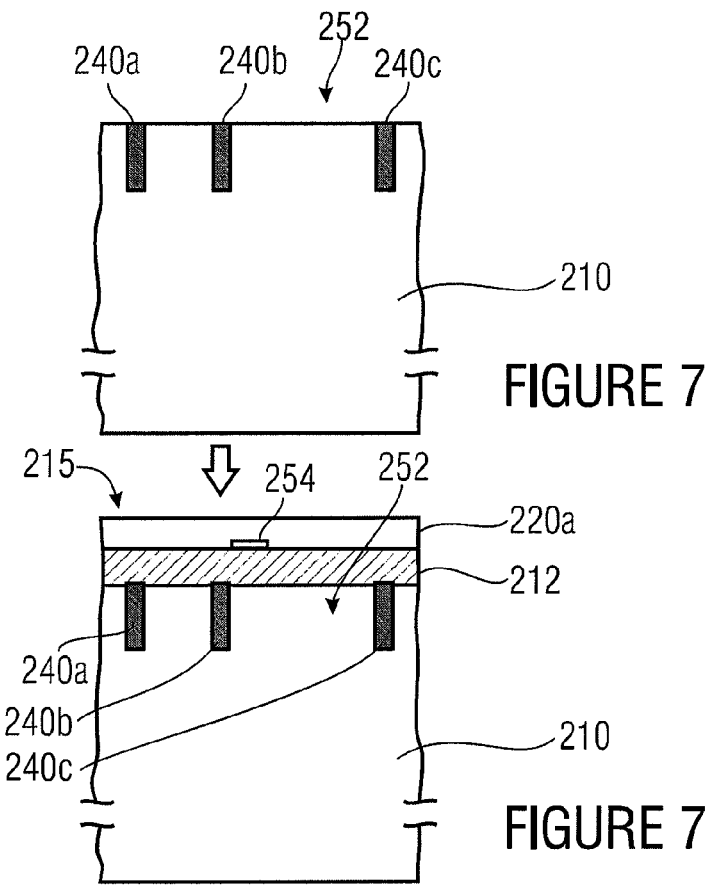
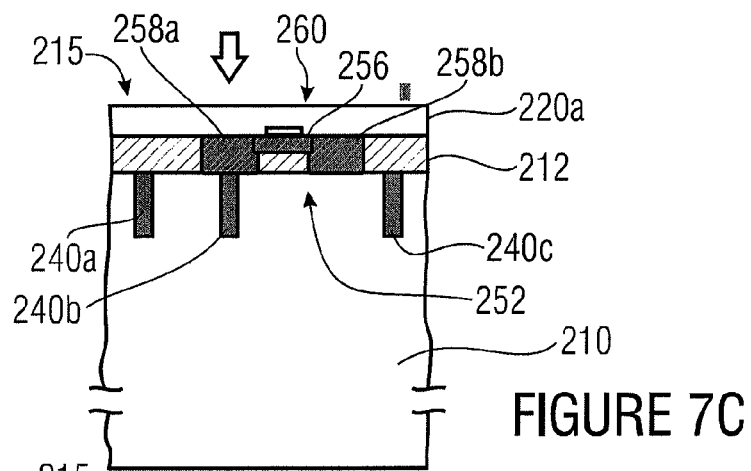
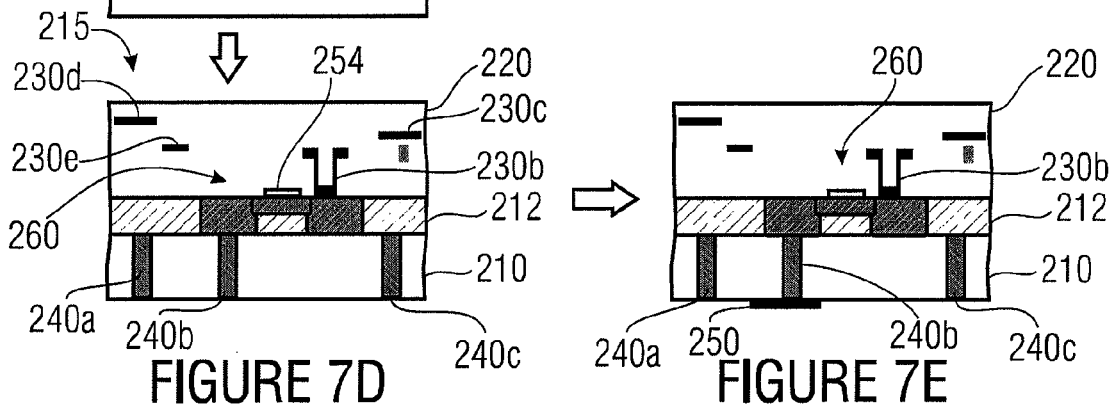
FIGURE 7A
FIGURE 7B
FIGURE 7C
FIGURE 7D
FIGURE 7E

ELECTRONIC SYSTEM AND METHOD FOR MANUFACTURING A THREE-DIMENSIONAL ELECTRONIC SYSTEM

CROSS-REFERENCE TO RELATED APPLICATIONS

This application is a National Phase of PCT/EP2008/007776 filed 17 Sep. 2008, which claims priority from German Patent Application No. 102007044685.5-33, which was filed on 19 Sep. 2007, and is incorporated herein in its entirety by reference.

BACKGROUND OF THE INVENTION

The present invention relates to an electronic system and to a method for manufacturing three-dimensional, electronic systems and, in particular, to a method for a three-dimensional integration of electronic systems using preprocessed starting substrates.

A three-dimensional integration is generally a vertical arrangement of devices, wherein the vertical connection relates to a direction with regard to a surface or main face of a substrate or a wafer surface. The connection may here include both a mechanical and also an electrical connection.

In the course of continuous miniaturization and the compact implementation of integrated circuits it is getting more and more important to use available space as optimally as possible with devices or circuits. This simultaneously leads to an increase of the performance of such optimally implemented systems, in particular when highly integrable vertical contacts may be selected freely by the substrate. With a use of silicon, for example, these are so-called "through-silicon vias" (TSV).

Conventional methods of three-dimensional integration with freely selectable vertical contacts are based on two possibilities:
 a) implementing vertical contacts (through-silicon vias) after a complete processing of the devices or the device substrates; and
 b) manufacturing the vertical contacts as parts of the device manufacturing, i.e. after completing the so-called front-end-of-line processes (FEOL), however before the so-called back-end-of-line processes (BEOL).

FEOL processes are generally all those processes which include processing the device in the substrate, but not implementing metallization and oxide layers which, for example, serve for contacting and connecting the devices and are part of the BEOL processes.

Examples for case a) are described in EP 070362 (Verfahren zur Herstellung einer vertikalen integrierten Schaltungsstruktur) and in EP 1171912 (Verfahren zur vertikalen Integration von elektronischen Bauelementen mittels Rückseitenkontaktierung). As mentioned above, in both cases the vertical contacts are made after the so-called FEOL processing. Case b) is described, for example, in Mater. Res. Soc. Symp. Proc. Vol. 970, p. 8. Implementing the vertical contacts here includes, for example, an etching process and a metallization (or generally filling up with conductive material) to make it electrically conductive.

One advantage of a method according to case a) compared to a method according to case b) is, for example, that the technology of device manufacturing is not influenced. Case b), however, is a method for a three-dimensional integration, in which the manufacturing of the vertical contacts is part of the device manufacturing, as the vertical contacts are made after the completion of the so-called FEOL processes, but before the BEOL processes. This is why methods according to b) are disadvantageous in so far as a complete compatibility of the implementation of the vertical contacts with the BEOL processes is necessitated. On the other hand, these methods are, however, advantageous in so far as the vertical through-contacting does not have to be realized by relatively thick dielectric layers separating different metal layers of the multi-layer metallization. In addition to the substrate, (for example a silicon substrate), only a relatively thin dielectric layer below the first metallization layer is affected by forming (e.g. by etching) the vertical contacts.

SUMMARY

According to an embodiment, a method for manufacturing a three-dimensional electronic system, may have the steps of providing a first integrated circuit structure in a first substrate, wherein the first integrated circuit structure has a contact pad at a first main side of the first substrate; providing a second substrate with a main side; forming a recess in the second substrate from the main side to form a vertical contact area; after step (c), epitaxial growth of a semiconductor layer on the main side of the second substrate with the vertical contact area; forming a semiconductor device of a second integrated circuit structure in the second substrate with the semiconductor layer, the semiconductor layer serving as a substrate layer for the semiconductor device; removing substrate material from a side of the second substrate opposite to the main side, so that the vertical contact area at the opposite side is electrically exposed; arranging the first and second substrates on top of each other aligning the vertical contact area with the contact pad, so that an electrical connection between the first and second integrated circuit structures is produced via the vertical contact area and the contact pad.

According to another embodiment, an integrated, electronic circuitry of a three-dimensional electronic system may have a first substrate with a main side on which a first dielectric layer structure with a first contact pad is arranged, wherein in the first dielectric layer structure a connecting structure is formed and the connecting structure is electrically connected to the first contact pad via a first contact area; a second thinned substrate with a main side on which an epitactic semiconductor layer, a second dielectric layer structure and a contact pad are formed, wherein the epitactic semiconductor layer is arranged between the second dielectric layer structure and the thinned substrate, and wherein the dielectric layer has a part of a connecting structure, and wherein the second thinned substrate further has a vertical via an electrical contact between the part of the connecting structure and the further contact pad, wherein the vertical contact area has a regular trench arrangement, wherein a distance (d1) of adjacent trenches is smaller than a lateral extension (d2) of the part of the connecting structure, and wherein the first contact pad and the second contact pad are electrically and mechanically connected to each other.

The present invention is based on the finding that a method for manufacturing a three-dimensional electronic system or a three-dimensional integration is enabled by first providing a first integrated circuit structure in a first substrate, wherein the first integrated circuit structure comprises a contact surface on a main side or surface of the first substrate. Further, at a main side of a second substrate a vertical contact area is formed, wherein the vertical contact area extends vertically to the main side of the second substrate. In a subsequent step, a semiconductor layer (or epitactic layer) is formed on the main side of the second substrate. In the resulting second substrate with the epitactic layer, at least one semiconductor device of a second integrated circuit structure is formed. Subsequently, substrate material is removed from a side opposite to the main side of the second substrate such that the vertical contact area is exposed on the opposite side. Finally, the first and second substrates are arranged on top of each other, so that the vertical contact area contacts the contact pad and an electric connection between the first and the second integrated circuit structure may be made via the vertical contact area and the contact pad and thus a three-dimensional, integrated circuit is generated. The implementation of the epitactic layer may, for example, be done by a corresponding growth process, wherein the substrate material grows maintaining the grid structure.

Embodiments of the present invention thus describe a method for manufacturing three-dimensional electronic systems, wherein first of all the first substrate and the second substrate are provided, wherein in the first substrate already one or several devices were processed. In the second substrate, first of all, however, no devices are realized, and instead the vertical, electric through-contacting (vias) (vertical contacts or contact areas) to be realized later are prepared first of all in a first step. This may be executed such that first of all a recess, like a trench, hole or a trench structure is provided in the second substrate. The lateral surfaces of the recess may, if applicable, be insulated from the substrate by applying or introducing dielectric material. Subsequently, as mentioned above, the second substrate is provided with an epitactic layer at its surface (main side) which serves for manufacturing the device as a substrate layer (or is suitable for this purpose).

Forming the epitactic layer may here be executed such that the recess is closed, but not filled. The epitaxial layer, for example, covers the recess. In order to achieve this, the opening width of the recess may be selected smaller than a medium free path length of the substrate atoms, arranging according to the grid structure on the second substrate during epitactic segregation. When the medium free path length of the segregating substrate atoms is greater than a lateral expansion of the recess, then the segregating atoms will find no way to segregate deeper into the recess in the second substrate and a closure only takes place at the upper part.

In further embodiments, in a process sequence, the devices to be integrated are processed in the second substrate. The devices are electrically connected via connecting structures and vias (e.g. vertical contact areas). The connecting structures may, for example, be implemented as metallic or conductively doped (semiconductor) contact areas and be realized within the scope of device manufacturing at the later positions of the vertical contacts—they are thus implemented in a vertical direction above the recess in the second substrate. After a complete processing of the devices, the second substrate is thinned from the back side (=the side opposite the main side) and/or substrate material is removed, so that the recess is opened on the back side or the bottom side.

The recess may subsequently be elongated from the back side for example by etching the substrate layer (e.g. epitaxial layer) and, if applicable, from a dielectric layer up to the above-described contact pad. When this is done, the recess may be filled with a conductive material (e.g. copper), so that a contacting at the contact surfaces or connecting structures takes place. On the back side surface, the recess filled with a conductive material may be provided with a structured metal contact pad. The structured metal contact pad may, for example, comprise copper or tin or also other conductive materials. Alternatively, also other non-metallic materials may be applied.

The first substrate may, in some embodiments, for example, also be provided with a patterned metal face or another contact pad, which may, for example, also comprise copper or tin. The patterned metal face at the first substrate may again be connected to one of the wiring planes of a device in the first substrate through vias. The wiring planes may, for example, be implemented as metallization planes in an MOS structure, wherein within the semiconductor substrate doped areas are implemented which are again connected to each other using vias and through wiring planes.

In a subsequent step, the second substrate may now be connected mechanically and electrically conductively, via the described patterned metal surfaces, to the first substrate, back side to front side, i.e. the two implemented contact pads facing each other.

The method of contacting the two patterned metal faces used in embodiments of the present invention may, without loss of generality, for example be executed according to a conventional soft soldering process or according to a low temperature soldering method. Soft soldering methods are often based on a "solid liquid interdiffusion" of two metals and enable a stable connection far above the bonding temperature. Accordingly, when bonding (connecting the two patterned metal faces) a eutectic alloy is formed whose melting point after bonding is higher than the melting points of the individual components before the bonding. Thus, an irreversible connection is formed in so far as it is stable regarding those conditions under which it resulted. Examples of metal combinations which may be used according to embodiments of the present invention for an electric and mechanical connection are copper and tin or gold and titanium, each for front and back side contacts and/or for contacts at the first and second substrates. Thus, the devices of the first and second substrate are three-dimensionally integrated and connected to each other via the vertical, electrically conductive trench structures between the device wirings.

The method just described presents an embodiment (variant 1) of the present invention. In one variant 2 of the above-described method, the metallization of the recess, instead of from the back side after thinning the second substrate, may also be executed before thinning from the front side. In this respect, before manufacturing the metallic or doped conductive contact areas the substrate layer (e.g. the epitactic layer) may be opened above the recess and the recess may subsequently be provided with a conductive material (e.g. copper). After the subsequent, complete processing of the devices, again the second substrate is thinned from the back side, until the now already metallized recess is opened and may be provided with a structured and/or patterned contact pad at the back side surface, as described above. The patterned contact pad may, for example, again comprise copper or tin.

In a further embodiment (variant 3) of the above-described method, the metallization of the recess is already executed before segregating the exemplary epitactic layer which is suitable as a substrate layer for the manufacturing of the device. The device may, in a further embodiment, of course also be implemented in the second substrate or extend into the second substrate via the epitactic layer. If, however, the recess was already filled with a conductive material before the segregation of the exemplary epitactic layer, care is to be taken that the metallization is compatible with the overall processing (FEOL and BEOL processing) of the devices. In such a case, tungsten may, for example, also be used as a possible metallization.

In further embodiments, the described variants of the manufacturing of vertical electrical connections may advantageously also be executed without an adjustment of the metallic or doped conductive areas. In this respect, the second substrate may be provided with a regular trench arrangement which is as dense as possible. The regular trench arrangement may, for example, be implemented in the form of a translation-symmetrical raster or a translation-symmetrical grid and include, for example, an orthogonal or hexagonal raster. The contact pads which are formed in the manufacturing of the devices should be selected in a suitable size with respect to the trench raster in order to achieve extensive freedom with regard to a positioning of the selected vertical vias. The other way round, the raster arrangement may also be selected accordingly narrow so that a vertical via to the raster is possible without an adjustment. For contact areas of a certain size the contacting would be given. By such a method it becomes possible to provide virtually universally usable preprocessed starting substrates for the manufacturing of three-dimensional, integrated electronic systems.

Embodiments of the present invention are thus advantageous with regard to a three-dimensional integration of electronic systems in so far that thus, among other things, a clearly higher packing density and a higher switching speed is achievable. The reduced circuit paths, as compared to conventional two-dimensional systems (planar technology) present a clear performance gain. Compared to planar technology, the achievable advantages predominate, in spite of increased manufacturing costs, in particular with a disadvantageous process management of the three-dimensional integration.

BRIEF DESCRIPTION OF THE DRAWINGS

In the following, embodiments of the present invention are explained in more detail with reference to the accompanying drawings, in which:

FIGS. 5A-5E show a third embodiment of a process management for implementing an integrated circuit structure with vertical contact areas; FIGS. 7A-7E show a fourth embodiment of a process management for implementing an integrated circuit structure with vertical contact areas.

DETAILED DESCRIPTION OF THE INVENTION

Figures 1A, 1B:
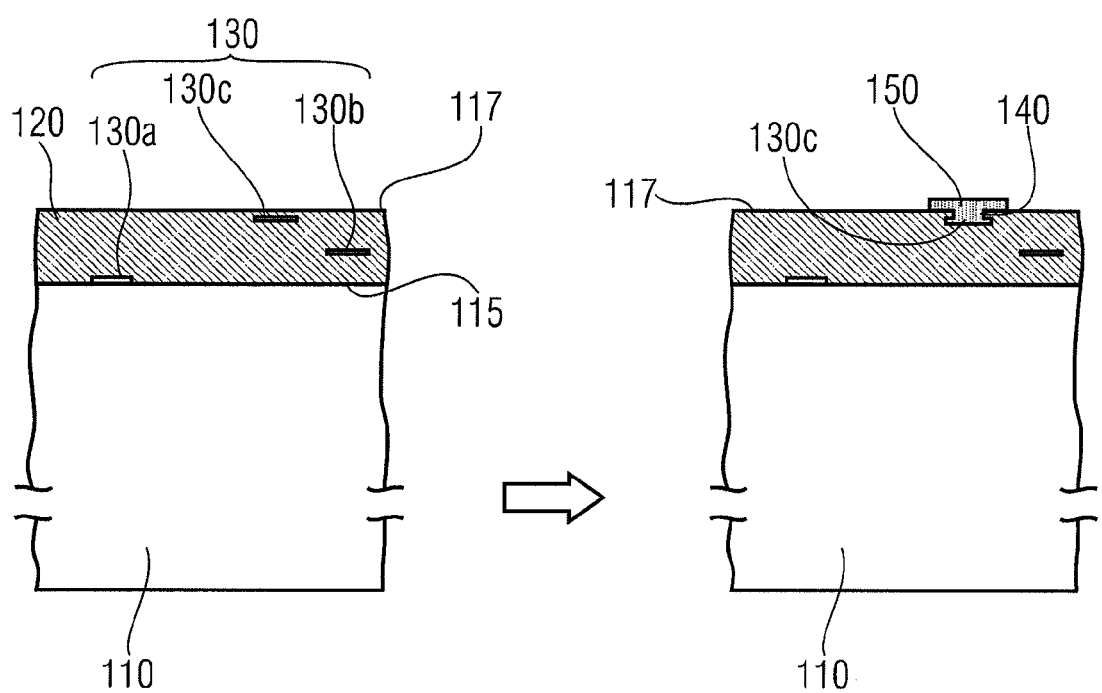
FIGS. 1A,1B show sectional views through a first substrate with completely processed devices with and without a via.

With regard to the following description, it should be noted that in the different embodiments like or similar functional elements are provided with the same reference numerals and a description of those functional elements is mutually interchangeable within the different embodiments.

FIGS. 1A and 1B show sectional views of a first substrate 110 with a first integrated circuit structure. Specifically, FIG. 1A shows the first substrate 110 with a main side 115 (e.g. one of the main surfaces of a wafer), onto which a layer structure 120 is segregated, so that a new surface 117 is formed. The layer structure 120 generally includes several layers, wherein between the several layers (e.g. up to six layers) contacting planes or connecting structures 130 (for example metallizations) may be formed. In the example of FIG. 1A, a first connecting structure 130a (e.g. a gate contact for an FET) is close to the surface 115. A second connecting structure 130b and a third connecting structure 130c are also embedded into the layer structure 120. Generally, the connecting structures 130 are implemented in a layer shape, so that they extend vertically to the drawing plane of FIG. 1A and are connected through vias either with each other or with the substrate 110 or the doped areas in the substrate 110. The connecting structures 130 comprise a conductive material, like, for example, metals or doped semiconductor material. The first substrate 110, for example, comprises silicon and the first layer structure 120 may, for example, comprise a layer thickness of four to six micrometers.

FIG. 1B shows a step in which a via 140 was formed from the surface 117 to the third connecting structure 130c and was filled with a conductive material. Subsequently, on the surface 117 a contact pad 150 was formed. The contact pad 150 later serves for a vertical contacting of a second circuit structure to which it is connected.

Figure 2A:
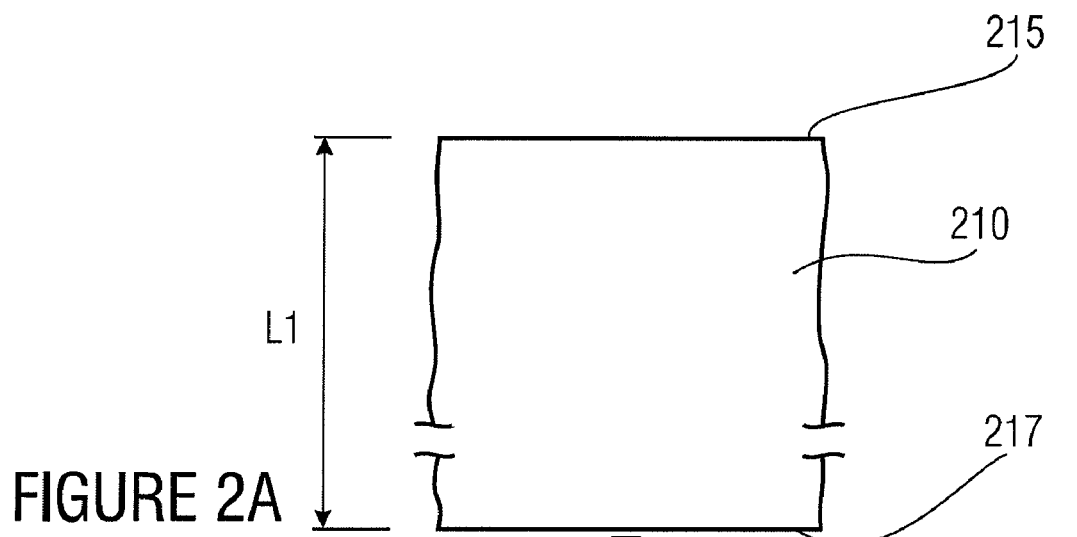
FIGS. 2A-2E show a first embodiment of a process management for the implementation of an integrated circuit structure with a vertical contact area in the second substrate.

FIGS. 2A to 2E show sectional views of a step sequence for generating the second integrated circuit structure. FIG. 2A shows the second substrate 210 with a main side 215 and an opposite side 217, wherein the second substrate 210 may, for example, include silicon with a layer thickness of approx. 780 μm.

Figure 2B:
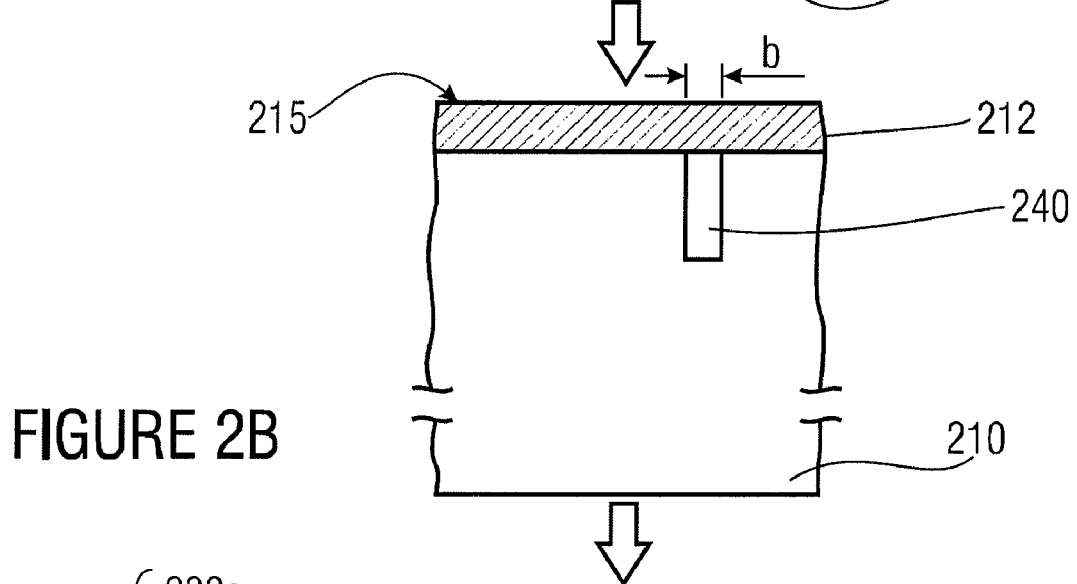

FIG. 2B shows how, in a first step, an opening or a vertical contact area 240 is generated in the second substrate 210 which extends vertically to the main side 215 of the second substrate 210. Subsequently, an epitactic layer 212 is formed on the main side 215 of the second substrate 210. With the epitactic growth of the layer 212 on the second substrate 210 it is advantageous to implement the process management such that the substrate material which grows epitactically on the second substrate 210 does not segregate in the vertical contact area 240, so that the vertical contact area 240 is closed from the top—without closing the vertical contact area 240 with the substrate material, so that a cavity or cavity area remains. This advantageous process management may, for example, be achieved by selecting the width extension b of the vertical contact area 240 such that it is smaller than the average and/or medium free path length of the epitactically growing atoms of the substrate material. Thus, it may be guaranteed, that the atoms segregate on the surface, but cannot reach into the vertical contact area 240. The epitactic layer 212 may, for example, comprise a layer thickness between 50 and 100 μm and the vertical contact area 240 may be formed as a so-called through-silicon via (TSV).

Figure 2C:
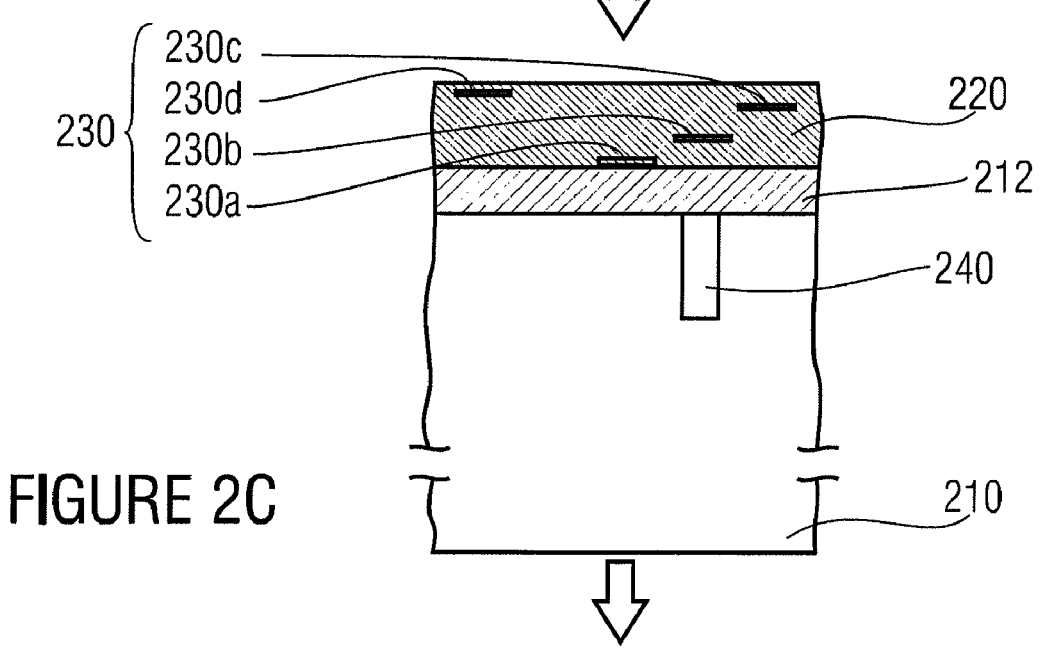

FIG. 2C shows subsequent processing steps which may, for example, include depositing a second layer structure 220. The second layer structure 220 may include several layers between which electric connecting planes 230 are embedded, wherein the electric connecting planes 230 may, for example, include conductive material or doped semiconductor material and the second layer structure 220 may comprise an insulating material (e.g. oxide). In the embodiment illustrated in FIG. 2C, the connecting structures 230 include four connecting structures 230a to 230d which are generally implemented on different planes in the second layer structure 220 and again extend vertically to the drawing plane and may be connected to each other. A contacting may also exist to the substrate lying below or the epitactic layer 212. The second layer structure 220 may comprise layers with a different dielectric material, wherein often the bottommost dielectric layer which comes after the epitactic layer 212 comprises a dielectric material with a low dielectric constant E and is frequently thinner than the following dielectric layers of the second layer structure 220.

Figure 2D:
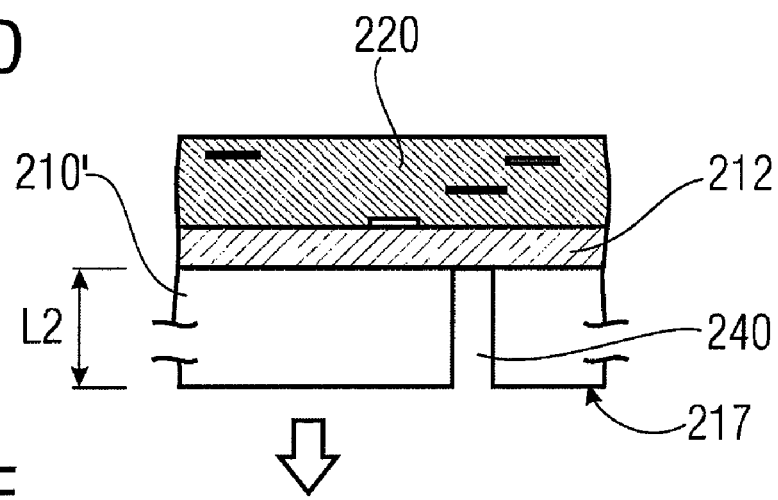

FIG. 2D shows how, in a subsequent step, the second substrate 210 is thinned from the opposite side 217, so that a thinned substrate 210' results. Thinning the substrate 210 may, for example, be executed by a removal (e.g. grinding or etching) and reduces the layer thickness 11 of the substrate 210 to a layer thickness 12 which may be selected such that the vertical contact area 240 is opened and thus on the opposite side 217 an opening results at the location of the vertical contact area 240.

Figure 2E:
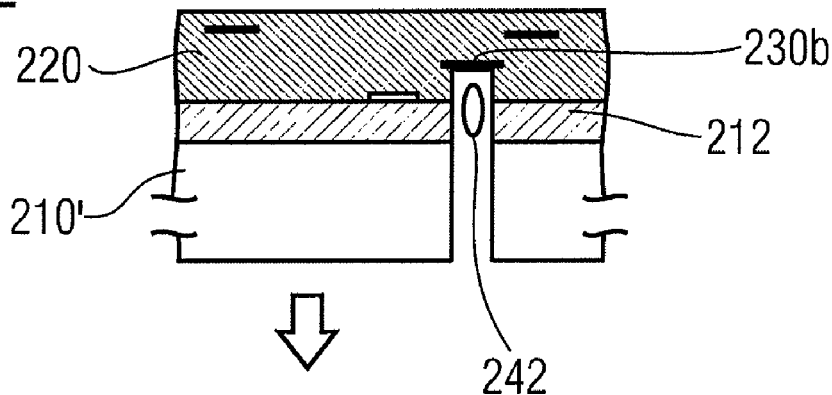

FIG. 2E shows how, in a subsequent step, the vertical contact area 240 is further deepened from the opposite side 217, i.e. until the vertical contact area 240 reaches the second connecting structure 230b. This may, for example, be done by an etching process in which the epitactic layer 212 and also a part of the second layer structure 220 formed between the epitactic layer 212 and the second connecting structure 230b is removed. This etching process may also be executed in several steps, wherein in the first step the epitactic layer 212, for example comprising silicon, is etched and in a subsequent step an etching process is used in which the part of the layer structure 220 is removed. In this etching process, the second connecting structure 230b acts as a stop layer on which the etching process stops. The etching process is thus selected such that it naturally stops on the material of the second connecting structure 230b. In this etching process, thus the vertical contact area 240 is enlarged or extended by a further area 242. Subsequently, the vertical contact area 240 may be filled with a conductive material. Finally, on the opposite side 217 a contact area may be formed.

The process management, as it is illustrated in FIGS. 2A to 2E, thus necessitates the vertical contact area 240 and the second part of the connecting structure 230b to be adjusted with regard to each other so that an electrical connection may be made. This may, for example, be executed such that on the one hand the vertical contact area is arranged at a fixed location (where later the second part of the connecting structure 230b is implemented). On the other hand, also the second part of the connecting structure 230b is to be implemented as close as possible (e.g. above) to the vertical contact area 240.

Figure 3:
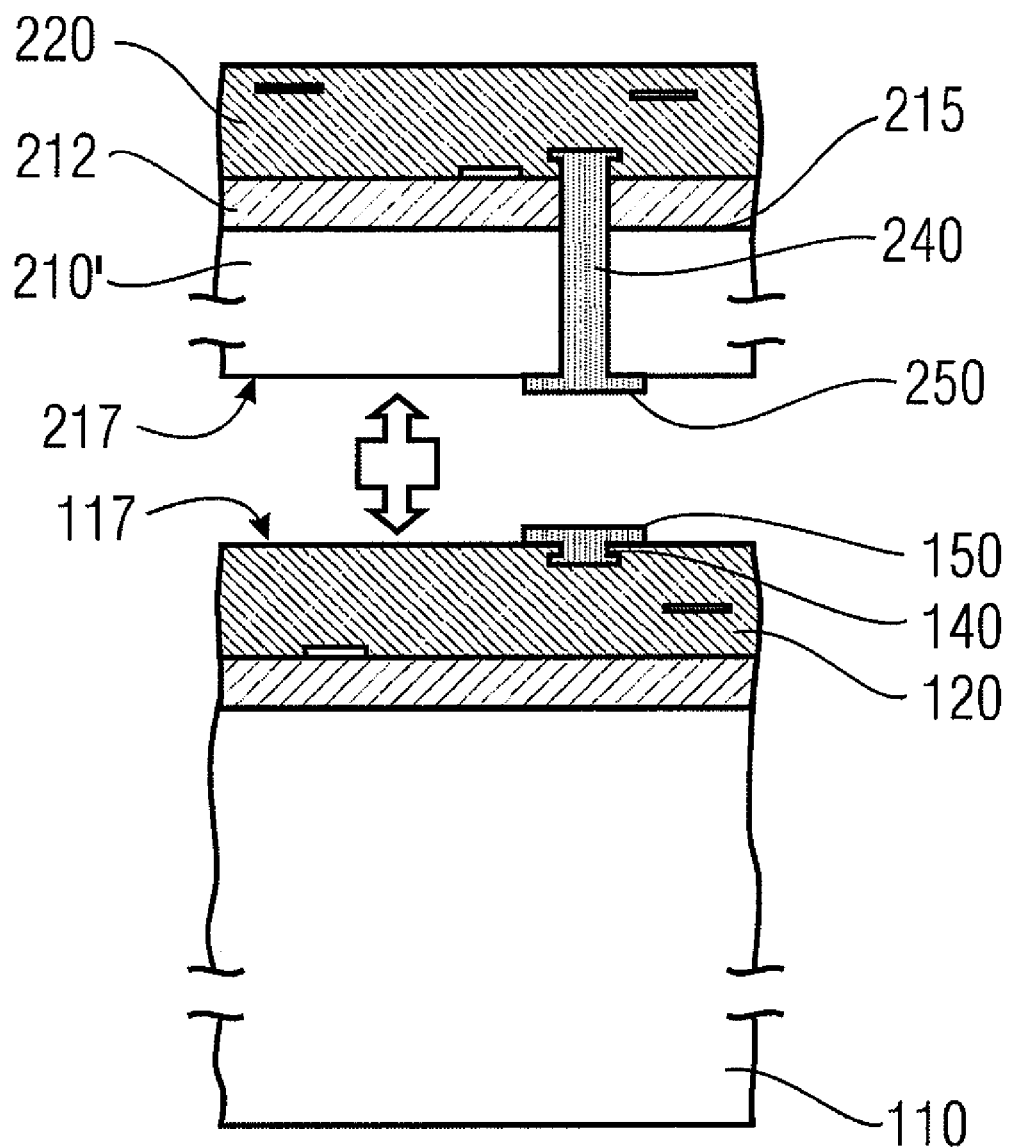
FIG. 3 shows an illustration of a vertical arrangement of the first and second substrates according to an embodiment.

FIG. 3 on the one hand shows the second thinned substrate 210' with the epitactic layer 212 and the second layer structure 220, wherein the vertical contact area 240 is filled with a conductive material and along the opposite side 217 a contact area 250 was arranged. On the other hand, FIG. 3 shows the first substrate 110 with the first layer structure 120, wherein on the main side 117 the contact pad 150 is formed. The first and the second thinned substrates 110 and 210' are brought together in the process step illustrated in FIG. 3 along the first main side 117 and the opposite side 217, i.e. such that the contact area 250 and the contact pad 150 are contacted and thus an electrical connection may be made. The contacting and/or connecting of the contact area 250 with the contact pad 150 may here be executed such that an interdiffusion results so that both materials are permanently connected to each other. This is, for example, the case when the materials of the contact area 250 and the contact pads 150 comprise for example tin and/or copper (or alternatively tin and/or gold). The interdiffusion is executed under pressure and temperature influences which are selected such that a eutectic connection is formed. The conductive material with which the vertical contact area 240 and the further area 242 is filled may, for example, comprise copper.

FIGS. 4A to 4D show a further embodiment of a possible processing of the second substrate 210 to develop the second integrated circuit structure. The starting point in this processing is the process step for the second substrate 210, as it is illustrated in FIG. 2B.

Figure 4A:
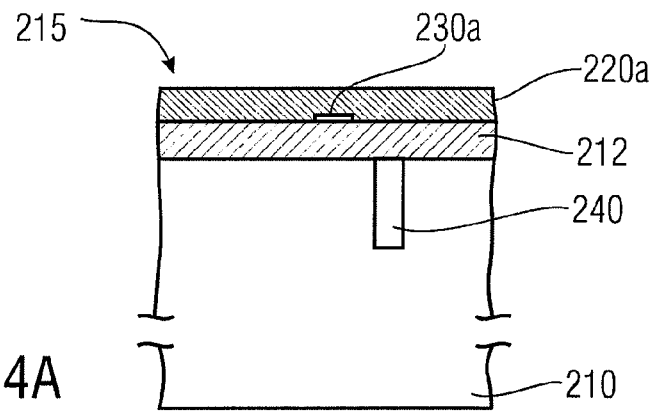
FIGS. 4A-4D show a second embodiment of a process management for implementing the integrated circuit structure with a vertical contact area in the second substrate.

FIG. 4A shows the second substrate 210 with the epitactic layer 212 which is formed at the main side 215 and covers the vertical contact area 240. In the embodiment illustrated in FIGS. 4A to 4D, subsequently first of all a first part of the layer structure 220a is formed on the epitactic layer 212. The first part of the second layer structure 220a may, for example, comprise a first part of the connecting structure 230a and include, for example, a control contact of an MOSFET. In this case, in the epitactic layer 212 for example doped areas (a drain and a source area) are formed.

Figure 4B:
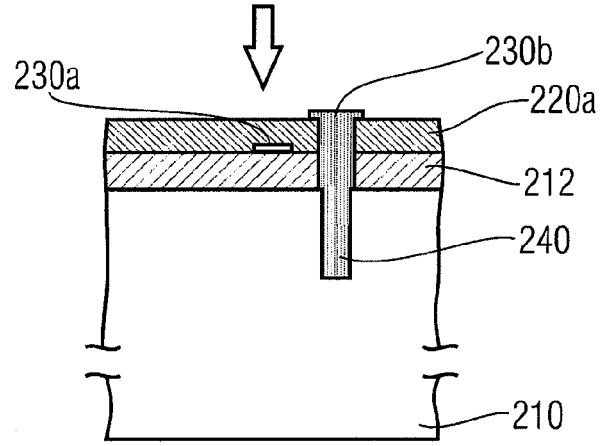

FIG. 4B shows how in a subsequent step first the first part of the layer structure 220a and the epitactic layer 212 are opened above the vertical contact area 240 so that an enlarged vertical contact area 240 results which is formed both in the substrate 210 and also in the epitactic layer 212 and the first part of the layer structure 220a. Subsequently, the vertical contact area 240 may be filled with a conductive material (for example copper). Then, a second part of the connecting structure 230b is implemented such that the second part of the connecting structure 230b forms an electrical connection with the vertical contact area filled with an electrically conductive material.

Figure 4C:
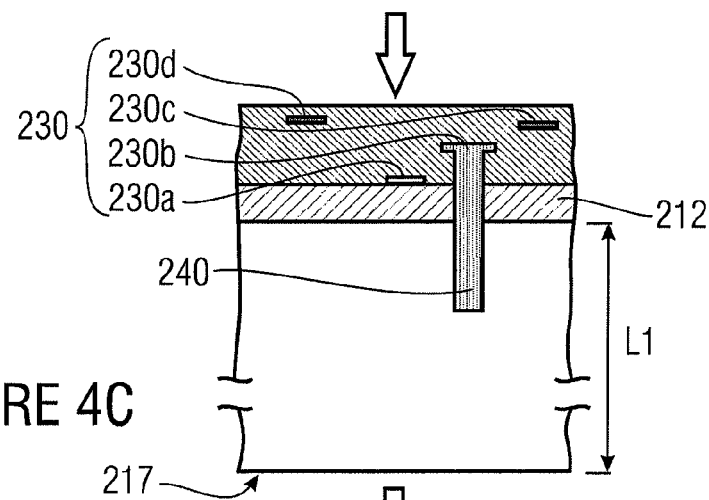

In FIG. 4C, a sectional view of the second substrate 210 and the epitactic layer 212 and also of the completely processed second layer structure 220 is illustrated. The second layer structure 220 may here comprise several layers which may be interrupted by electrically conductive connecting structures 230. These layers may be deposited onto the structure illustrated in FIG. 4B one after the other. Specifically, the embodiment of FIG. 4C shows that, next to the already implemented first and second parts of the connecting structure 230a and 230b, additionally a third and a fourth part of the connecting structure 230c, 230d is implemented. In this step of processing, the second substrate 210 comprises the layer thickness of 11, which is thinned in the subsequent step from the opposite side 217.

Figure 4D:
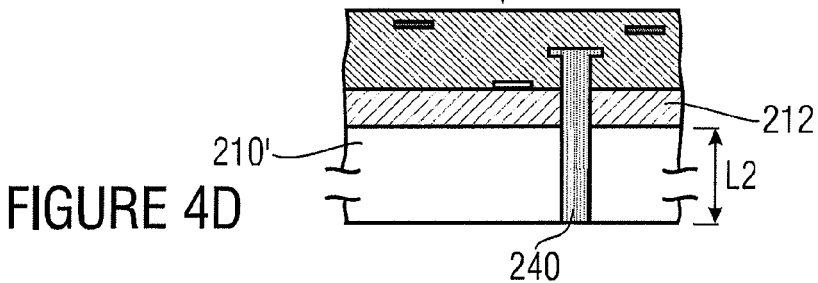

FIG. 4D shows the result of the back side thinning, i.e. the result of removing substrate material of the second substrate 210, so that a thinned, second substrate 210' is formed. The thinned, second substrate 210' comprises a layer thickness 12 which may in turn be selected such that the vertical contact area 240 filled with a conductive material results on the opposite side 217 and becomes contactable.

This thinned second substrate 210' processed up to this point with the second integrated circuit structure may again be provided with a contact area on the opposite side 217, wherein the contact area 250 (see FIG. 3) is positioned such that it is in an electric contact with the vertical contact area 240 filled with a conductive material. As it is illustrated in FIG. 3, the thinned second substrate 210' processed up to this point may be connected with the first substrate 110, so that the contact area 250 forms an electrical contact with the contact pad 150. In this respect, again a soldering method may be used, which for example uses the interdiffusion for forming a eutectic connection.

Figure 5D:
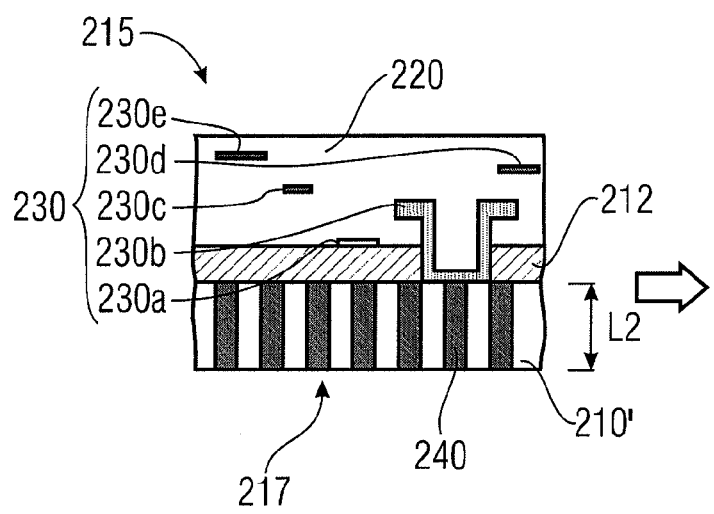

In FIGS. 5A to 5E again a further embodiment is illustrated comprising a modified process management for the second substrate 210. In the process management illustrated in FIG. 5, the vertical contact areas 240 are directly filled with conductive material after they have been generated so that the structure illustrated in FIG. 5A results. The contact areas may, for example, again be generated by means of an etching method which in turn uses a suitable mask. In FIG. 5A it is further illustrated that the vertical contact area 240 may comprise several areas 240a to 240g which may, for example, be implemented as trenches or holes or raster patterns (see also FIG. 6).

FIG. 5B shows how, in a subsequent step, on the main side (main surface) 215 first of all the epitactic layer 212 is segregated and subsequently a first part of the second layer structure 220a is applied onto the epitactic layer 212. The first part of the second layer structure 220a may, for example, again comprise a first part of a connecting structure 230a.

FIG. 5C shows how subsequently on the main side 215 a second part of the connecting structure 230b is formed and contacted with the vertical contact area 240 filled with a conductive material. This may be executed such that first of all the first part of the second layer structure 220a and the epitactic layer 212 are opened at the location of the second part of the connecting structure 230b. Here, again one or also several etching steps may be used which finally stop on the substrate 210 or the vertical contact area 240 filled with the conductive material. After opening the first part of the second layer structure 220a and the epitactic layer 212, the second part of the connecting structure 230b may be formed in the resulting opening, wherein the second part of the connecting structure 230b may also partially extend along (or in parallel to) the main side 215.

It is illustrated in FIG. 5D how the remaining part of the second layer structure 220 is deposited onto the main side 215 on the structure illustrated in FIG. 5C. Like in the embodiments above, the second layer structure 220 may comprise several parts of the connecting structure 230 (e.g. a first to fifth part 230a to 230e). It is further illustrated in FIG. 5D that the substrate 210 is thinned from the opposite side 217 until the vertical contact area 240 filled with the conductive material appears on the opposite side 217. The thinned, second substrate 210' thus comprises a layer thickness 12, wherein the layer thickness 12 is equal to or smaller than the depth of the vertical contact area 240 in FIG. 5A.

Figure 5E:
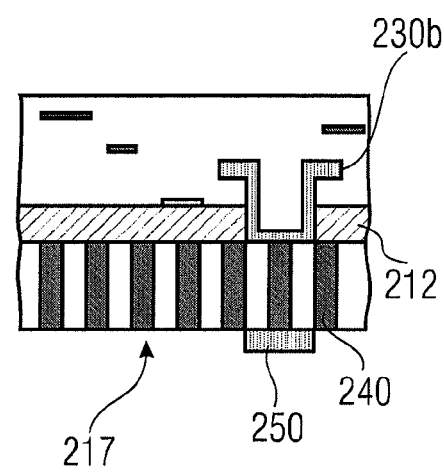
Figure 6:
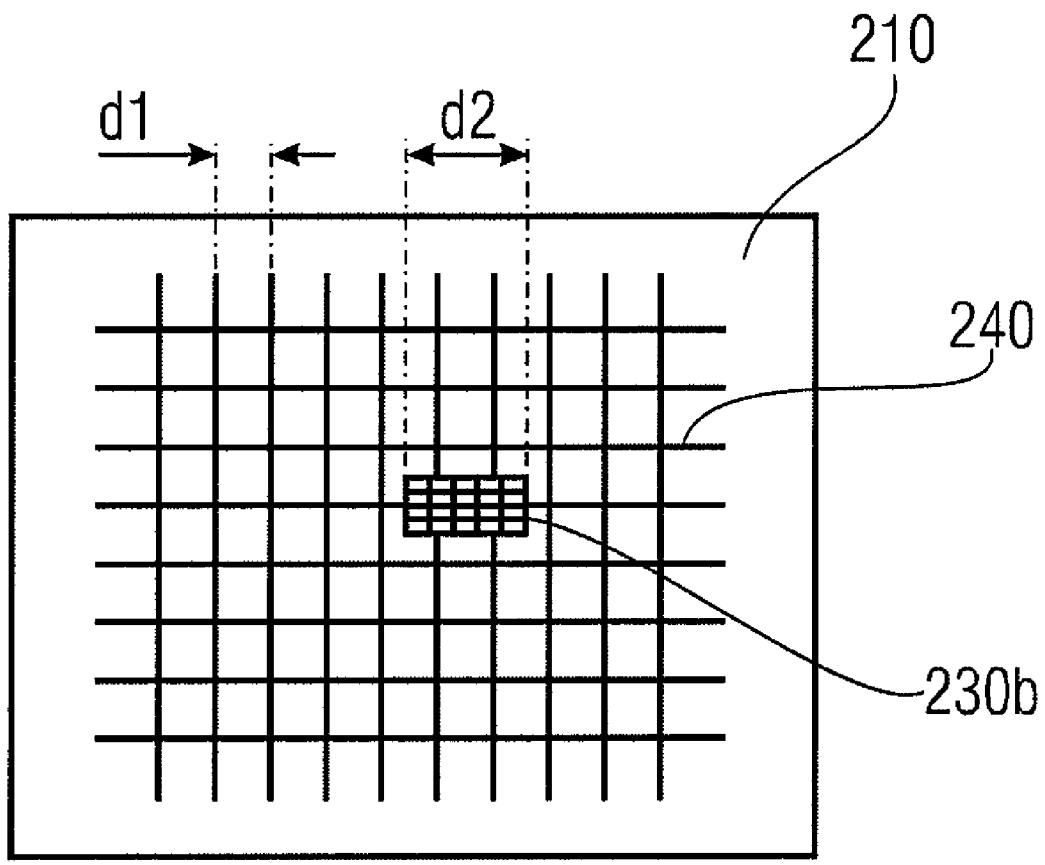
FIG. 6 shows a top view onto the second substrate, wherein the vertical contact area comprises a raster structure.

FIG. 5E shows a subsequent process in which on the opposite side 217 again a contact area 250 is formed so that an electrical connection between the contact area 250, the vertical contact area 240 filled with the conductive material and the second part of the connecting structure 230b is formed. The thus processed second substrate with an integrated circuit structure may again, as illustrated in FIG. 3, be brought together with the first substrate so that the contact area 250 electrically contacts the contact pad 150 of the first substrate 110. FIG. 6 shows a top view onto the second substrate 210 of FIG. 5 with the vertical contact areas 240 formed therein extending vertically to the drawing plane into the second substrate 210. As illustrated in FIG. 6, the vertical contact area 240 may show different forms and in particular also be implemented as a raster pattern (further possible shapes would be trenches, holes or also irregularly shaped areas). As illustrated in FIG. 5, it is here advantageous when the distance of adjacent trenches in the raster pattern illustrated in FIG. 6 is a distance d1 which is selected smaller than, for example, a lateral extension d2 of the second part of the connecting structure 230b. It is thus guaranteed that, by a simple opening of the first part of the second layer structure 220a and the epitactic layer 212 (see FIG. 5C), a part of the vertical contact area 240 becomes contactable. It is to be noted here that the second part of the connecting structure 230b may be shifted vertically to the drawing plane in FIG. 6 from the vertical contact area 240 and, in particular, that further an epitactic layer 212 and a first part of the layer structure 220a may be formed on the vertical contact area 240. The implementation of the vertical contact area 240 in this form, as it is illustrated in FIG. 6, is, for example, advantageous in so far that adjusting the second part of the connecting structure 230b with the vertical contact area 240 is omitted (as it would have been necessitated, for example, in FIG. 2C and also in FIG. 2B). By the selected dimensionings for d1 and d2 it is guaranteed that a contacting of the vertical contact area 240 and the second part of the connecting structure 230b takes place.

In further embodiments, the process management described in FIG. 5, i.e. filling the vertical contact area 240 with a conductive material before the epitactic layer 212 is formed, is also used for the process management which was described in FIG. 2 and FIG. 4. Thus, between FIGS. 2A and 2B an intermediate step may be introduced, in which the vertical contact area 240 is filled with the conductive material. The step of filling with a conductive material may also be modified to the extent that first of all dielectric material is segregated at the side walls and/or the bottom of the vertical contact area 240 and a filling with conductive material takes place only after this. Thus, the conductive material would be surrounded laterally by a dielectric layer.

It is further possible to separately process a wafer with a vertical contact area 240 (like in FIG. 6) implemented as a raster and to fill the same with a conductive material. In the subsequent formation of devices (forming of doped areas in the epitactic layer or in the substrate 210 and also electrically connecting) the thus prepared second substrate 210 may be used as a basis.

It is further possible in further embodiments to generate a pattern for the vertical contact area 240 such that it includes two or more separated areas which may serve for an electrical contacting with a first substrate arranged on top or below without the two or more areas which are separated from each other showing an electrical connection.

Forming the integrated circuit structure in the first or the second substrate 110, 210 may, for example, include implementing doped areas which are connected, for example, to the connecting areas 230 through vias, so that electrical connections may form between different doped areas. The doped areas may be formed both in the epitactic layer 212 and also in the second substrate 210 or the first substrate 110. The thus obtained integrated circuit structures comprise the typical MOS structure (MOS=metal oxide semiconductor).

In other embodiments, also so-called SOI structures (SOI=semiconductor on isolator) may be processed accordingly. With such structures, the second substrate 210 includes, for example, first of all a semiconductor on which an isolator is implemented on which again a semiconductor may be implemented followed by a layer structures with connecting planes (metallization). The first and second layer structures 120 and 220 may comprise, for example, other insulating materials, like, for example nitrides instead of oxides. Further, the vertical manufacturing using a first and a second substrate 110 and 210 may be extended in so far as further substrates are arranged vertically or three-dimensionally on top of each other. This may, for example, be done simply by using the completely processed, three-dimensionally arranged device, as it is illustrated, for example, in FIG. 3, as a further first substrate with which a further second substrate is vertically connected.

In the process management illustrated in FIGS. 1 to 5, the first substrate 110 and the second substrate 210 may include parts or whole wafers which are, for example, vertically or three-dimensionally processed before dicing the devices. The epitactic layer 212 may, for example, comprise the same material as the second substrate 210 (e.g. silicon), wherein the material of the second substrate 220 may also comprise a porous or sponge-like and the epitactic layer 212 defines a well-defined crystal structure. When depositing the epitactic layer 212 it is further to be noted that the temperature is selected such that the free path length of the atoms of the epitactic layer 212 is greater than a lateral diameter of the vertical contact area 240, so that the atoms may not enter deeper into the vertical contact area 240.

Embodiments thus form the vertical contact area 240 during processing the devices. Thus, already during processing, the connecting structures (e.g. the second connecting structures 230b) are contacted correctly. Thus, after back side thinning the position of the exemplary second connecting structure 230b is known and the vertical contact area 240 which is laid open may be used for adjusting. This is a clear advantage compared to conventional methods, in which etching is, for example, only performed after processing and in which a high effort is needed to find out the exact position of the exemplary second connecting structure 230a to be contacted.

An alternative processing to that of FIGS. 5A to 5E is illustrated in FIGS. 7A to 7E, in which for functionally equal elements in the figures the same reference numerals were used as in FIGS. 5A to 5E and in which the description of the process steps and the individual elements with regard to the latter figures is basically to apply also for FIGS. 7A to 7E as far as they are not replaced by the following description.

In the process management of FIGS. 7A to 7E, the electrical connection between the connecting structure 230 in the isolating layer structure 220 is not done by a via 230, like, e.g., a recess filled or lined with metal, extending up to the main side of the substrate facing the epitactic layer. Rather, in FIG. 7A the electrical connection is formed via a highly doped zone of the here exemplary epitactic semiconductor layer 212.

In particular, as in FIG. 5A, first of all vertical contact areas 240 are generated and after the generation they are filled with a conductive material, so that the structure illustrated in FIG. 7A results. As illustrated in FIG. 7A, the vertical contact area 240 may comprise several areas 240a to 240c. They may be implemented as trenches, holes or raster patterns. In contrast to the illustration of FIG. 5A, the distance between the same is not regular. Rather, FIG. 7A shows an arrangement of areas 240a to 240c with a lateral recess 252 in an otherwise regular arrangement of areas 240a to 240c.

In a subsequent step, at the main side of the substrate 210 at which the contact areas 240a-c are exposed, the epitactic layer 212 is then deposited and/or segregated and subsequently a first part of the second layer structure 220a is applied to the epitactic layer 212, i.e. such that the first part of the second layer structure 220a comprises, as a first part of the connecting structure, a gate terminal 254 separated from the epitactic layer 212 via a gate oxide. For example by implanting methods, then individual areas or zones illustrated in a hatched manner in FIG. 7C are then highly (heavily) doped, i.e. such that below the gate terminal 254 in the epitactic layer 212 a channel area 256 is formed which is laterally adjacent to a source and drain area 258a or 258b, respectively, whereby by the elements 254-258b an FET 260 is formed. The source and drain areas 258a, 258b are heavily doped and extend beyond the same up to the main side of the substrate 210, from which the contact areas extend into the interior of the substrate. One of the two areas 258a,b is electrically connected to one 240b of the contact areas 240a-c, while the other is located in the area of the recess 252 and is thus not contacted towards the bottom. It is to be noted only as a precaution that the order illustrated in FIGS. 7B and C of the manufacturing of the structure 220a and the areas 258a,b is not obligatory and may be changed.

FIG. 7D then shows how subsequently on the main side 215 a second part of the connecting structure 230b is implemented, for example, in the form of a via or a recess provided with metal. In contrast to the embodiment of FIGS. 5A to 5E, the connecting structure is laterally positioned such that it does not pass through the epitactic layer to be in contact with the vertical contact area 240 filled with the conductive material, but the connecting structure only represents the connection to the other source or drain area 258b not contacted by the contact area 240b. Opening the epitactic layer 212 is thus not necessitated, whereby the lateral spatial requirements for the connecting structure 230b may be less than in FIG. 5C.

After opening the first part of the second layer structure 220a and the epitactic layer 212 again a second part of the connecting structure 230b may be formed in the resulting opening, wherein the second part of the connecting structure 230b may also partially extend along (or in parallel to) the main side 215. The result is illustrated in FIG. 7D.

FIG. 7E shows a final process, wherein on the opposite side 217 again a contact 250 is formed, so that via the contact area 240b on the one hand and the transistor 260 on the other hand an electrical connection between the contact 250 and the second part of the connecting structure 230b is generated. The thus processed, second substrate with an integrated circuit structure may again, as illustrated in FIG. 3, be brought together with the first substrate so that the contact 250 electrically contacts the contact pad 150 of the first substrate 110.

Similar to the embodiment described in FIGS. 7A to 7E, also the embodiment as it is illustrated in FIGS. 2A to 2E may be modified such that the vertical contact area 240 does not contact the part of the connecting structure 230b but instead contacts a doped area in the substrate 210 or in the epitactic layer 212. In this case, the epitactic layer 212 does not have to be completely etched through in the step of FIG. 2E, but etching is only needed as far as it serves for contacting the (heavily) doped area.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for manufacturing a three-dimensional electronic system, comprising:
(a) providing a first integrated circuit structure in a first substrate, wherein the first integrated circuit structure comprises a first contact pad at a first main side of the first substrate;
(b) providing a second substrate with a second main side;
(c) forming a recess in the second substrate from the second main side to form a vertical contact area;
(d) after step (c), epitaxial growth of a semiconductor layer on the second main side of the second substrate with the vertical contact area;
(e) forming a semiconductor device of a second integrated circuit structure in the second substrate with the semiconductor layer, the semiconductor layer serving as a substrate layer for the semiconductor device;
(f) removing substrate material from a side of the second substrate opposite to the second main side, so that the vertical contact area at the opposite side is electrically exposed;

(g) arranging the first and second substrates on top of each other aligning the vertical contact area with the first contact pad, so that an electrical connection between the first and second integrated circuit structures is produced via the vertical contact area and the first contact pad.

2. The method according to claim 1, wherein the step of forming the vertical contact area is executed such that an electrical connection is generated to the semiconductor device of the second integrated circuit structure.

3. The method according to claim 2, wherein forming the electrical connection to the semiconductor device of the second integrated circuit structure comprises contacting a heavily doped semiconductor material.

4. The method according to claim 3, wherein the step of contacting comprises contacting the heavily doped semiconductor material by the vertical contact area.

5. The method according to claim 1, wherein step (e) comprises forming the semiconductor device in the semiconductor layer.

6. The method according to claim 1, wherein after step (e) further a step of forming at least a part of a dielectric layer structure on the semiconductor layer is executed.

7. The method according to claim 6, wherein the step of forming at least one part of the dielectric layer structure comprises forming a connecting structure.

8. The method according to claim 7, wherein the step of forming the connecting structure comprises forming a metallization plane and the metallization plane comprises a contact to the semiconductor device of the second integrated circuit structure.

9. The method according to claim 7, wherein the step of forming the connecting structure comprises adjusting a part of the connecting structure with regard to the vertical contact area or the step of forming the vertical contact area comprises adjusting with regard to the part of the connecting structure, so that the part of the connecting structure and the vertical contact area are aligned laterally to each other.

10. The method according to claim 6, wherein forming at least one part of the dielectric layer structure comprises forming an oxide layer.

11. The method according to claim 1, wherein step (c) comprises forming the recess vertically to the second main side.

12. The method according to claim 1, wherein the recess comprises a side wall and wherein the step of forming the recess comprises forming a dielectric insulating layer at the side wall of the recess.

13. The method according to claim 1, wherein between the step (f) and the step (g) a step of:
extending the recess is executed such that via the thus resulting recess a part of the connecting structure is exposed, and further comprises a step
of filling the recess with a conductive material so that an electrical contact is generated to the part of the connecting structure.

14. The method according to claim 13, further including implementing a further contact area on the opposite side, and wherein the second contact pad is electrically contacted with the first contact pad in step (g).

15. The method according to claim 1, wherein the first contact pad and/or a second contact pad is formed using copper and/or tin.

16. The method according to claim 1, wherein after the step (d) an opening of the semiconductor layer is executed such that the opened epitactic layer exposes the vertical contact area.

17. The method according to claim 16, wherein after the step of opening the semiconductor layer a filling of the vertical contact area with a conductive material is executed and wherein further a step of forming a part of the connecting structure is executed such that the part of the connecting structure generates an electrical connection to the vertical contact area filled with the conductive material.

18. The method according to claim 1, wherein step (c) comprises filling the recess with a conductive material.

19. The method according to claim 18, wherein a step of opening the semiconductor layer is executed after step (d) and wherein a step of applying a conductive material onto the opened semiconductor layer is executed to form a part of the connecting structure, wherein an electrical connection to the vertical contact area filled with the conductive material is generated.

20. The method according to claim 19, wherein the step (d) comprises forming a part of a dielectric layer structure and wherein the step of opening the semiconductor layer comprises opening a part of the dielectric layer structure.

21. The method according to claim 1, further including a step of filling the vertical contact area with tungsten.

22. The method according to claim 1, wherein the step of forming the vertical contact area comprises forming a regular trench arrangement, so that a distance (d1) between neighboring trenches corresponds to no more than a lateral dimension (d2) of the part of the connecting structure.

23. The method according to claim 22, wherein the step of forming the part of the connecting structure and forming the vertical contact area takes place unadjustedly to each other.

24. The method according to claim 1, wherein the step of forming the vertical contact area, the step of forming the semiconductor device and the step of adjusting to each other are executed such that the electrical connection is generated such that the vertical contact area extends from the first contact pad to a heavily doped area of the semiconductor layer which is again adjacent to the second main side of the second substrate.

25. The method according to claim 24, wherein the step of forming the semiconductor device is executed such that the heavily doped area of the semiconductor layer forms one of a drain and a source area of a transistor, and the step (e) further comprises forming a dielectric layer structure with a metallization plane on the semiconductor layer connected to the respectively other one of the drain and source area of the transistor through a via.

26. The method according to claim 1, wherein step (g) comprises an interdiffusion method generating an electrical connection between the first and the second circuit structure.

27. The method according to claim 1, wherein the step of forming the vertical contact area and/or the step of removing substrate material comprises an etching process.

28. The method according to claim 1, wherein the step (c) of forming the vertical contact area comprises the use of copper.

29. An integrated electronic circuitry of a three-dimensional electronic system, comprising:
a first substrate with a first main side on which a first dielectric layer structure with a first contact pad is arranged, wherein in the first dielectric layer structure a connecting structure is formed and the connecting structure is electrically connected to the first contact pad via a first contact area;
a second thinned substrate with a second main side on which an epitactic semiconductor layer, a second dielectric layer structure and a second contact pad are formed, wherein the epitactic semiconductor layer is arranged between the second dielectric layer structure and the thinned substrate, and wherein the dielectric layer comprises a part of a connecting structure, and wherein the second thinned substrate further comprises a vertical via generating an electrical contact between the part of the connecting structure and the further second contact pad, wherein the vertical contact area comprises a regular trench arrangement, wherein a distance (d1) of adjacent trenches is smaller than a lateral extension (d2) of the part of the connecting structure, and wherein the first contact pad and the second contact pad are electrically and mechanically connected to each other.

30. The integrated, electronic circuitry according to claim 29, wherein the vertical contact area through-contacts the thinned second substrate, the semiconductor layer and a first part of the dielectric layer structure.

31. The integrated, electronic circuitry according to claim 29, wherein the vertical contact area and the first contact area are implemented such that a current flow from the part of the connecting structure and the connecting structure only takes place along one direction and the connecting structures are metallization planes of an MOS structure.

32. The integrated, electronic circuitry according to claim 29, wherein the regular trench arrangement of the vertical contact area comprises a translation-symmetrical raster.

33. The integrated, electronic circuitry according to claim 29, wherein the vertical contact area comprises tungsten and/or the further second contact pad comprises tin or copper.

* * * * *

UNITED STATES PATENT AND TRADEMARK OFFICE
CERTIFICATE OF CORRECTION

PATENT NO. : 8,324,022 B2
APPLICATION NO. : 12/678473
DATED : December 4, 2012
INVENTOR(S) : Peter Ramm and Armin Klumpp It is certified that error appears in the above-identified patent and that said Letters Patent is hereby corrected as shown below:

In the Claims

Column 15, line 7, Claim 30, remove the word "further".

Column 16, line 14, Claim 33, remove the word "further".

Signed and Sealed this
First Day of April, 2014

Michelle K. Lee
*Deputy Director of the United States Patent and Trademark Office*